United States Patent
Ramamurthy

(10) Patent No.: US 9,952,328 B2
(45) Date of Patent: Apr. 24, 2018

(54) ANTENNA PATTERN DATA MINING FOR AUTOMOTIVE GNSS RECEIVERS

(71) Applicant: QUALCOMM Technologies International, Ltd., Cambridge (GB)

(72) Inventor: Madhukar Ramamurthy, Karnataka (IN)

(73) Assignee: QUALCOMM Incorporated, San Diego, CA (US)

( * ) Notice: Subject to any disclaimer, the term of this patent is extended or adjusted under 35 U.S.C. 154(b) by 351 days.

(21) Appl. No.: 14/829,805

(22) Filed: Aug. 19, 2015

(65) Prior Publication Data
US 2017/0052260 A1    Feb. 23, 2017

(51) Int. Cl.
*G01S 19/22* (2010.01)
*G01S 19/23* (2010.01)
(Continued)

(52) U.S. Cl.
CPC .............. *G01S 19/23* (2013.01); *G01S 19/22* (2013.01); *G01S 19/24* (2013.01); *G01S 19/42* (2013.01);
(Continued)

(58) Field of Classification Search
CPC .......... G01S 19/23; G01S 19/22; G01S 19/24; G01S 19/35; G01S 19/42
(Continued)

(56) References Cited

U.S. PATENT DOCUMENTS 5,548,837 A *  8/1996  Hess ..................... H04B 7/10
                                                      343/757
6,031,498 A    2/2000  Issler
(Continued)

FOREIGN PATENT DOCUMENTS

DE         10028900 A1    12/2001

OTHER PUBLICATIONS

Aloi D.N, "Correlation between Antenna Radiation Pattern and Field Performance for Global Positioning Systems in Telematics as a Function of Antenna Placement," IET Microwaves Antennas & Propagation, Mar. 3, 2008 (Mar. 3, 2008), vol. 2(2), pp. 130-140, XP006030601, ISSN: 1751-8733, DOI: 10.1049/1ET-MAP:20060340.
(Continued)

*Primary Examiner* — Chuong P Nguyen
(74) *Attorney, Agent, or Firm* — Procopio, Cory, Hargreaves & Savitch LLP

(57) ABSTRACT

The system provides a global navigation satellite system (GNSS) receiver in a vehicle. The GNSS receiver includes a radio frequency (RF) receiving circuit configured to receive GNSS signals from a plurality of GNSS satellites orbiting Earth at respective azimuth and elevation angles, a memory device storing an predetermined antenna pattern including initial signal to noise ratio (SNR) values for each of the respective azimuth and elevation angles, and a processor. The processor is configured to calculate SNR values of the received GNSS signals, iteratively calculate an updated antenna pattern by combining the calculated SNR values with the initial SNR values, compare further SNR values of further received GNSS signals to the SNR values in the updated antenna pattern to perform at least one of the following: 1) detection and mitigation of multipath signals, 2) estimation of vehicle heading, and 3) determination of a location of the antenna within the vehicle.

20 Claims, 10 Drawing Sheets

(51) Int. Cl.
  *G01S 19/42* (2010.01)
  *G01S 19/24* (2010.01)
  *G01S 19/36* (2010.01)
  *G01S 19/53* (2010.01)
  *G01R 29/10* (2006.01)

(52) U.S. Cl.
  CPC .............. *G01R 29/10* (2013.01); *G01S 19/36* (2013.01); *G01S 19/53* (2013.01)

(58) Field of Classification Search
  USPC ............ 342/357.61, 357.62, 357.63, 357.75, 342/357.25
  See application file for complete search history.

(56) References Cited

U.S. PATENT DOCUMENTS

| | | | | |
|---|---|---|---|---|
| 6,313,786 | B1* | 11/2001 | Sheynblat | G01C 21/206 342/357.23 |
| 6,329,945 | B1 | 12/2001 | Hynes | |
| 6,646,596 | B2* | 11/2003 | Syrjarinne | G01S 5/02 342/357.25 |
| 6,731,240 | B2* | 5/2004 | Dybdal | G01S 3/023 342/354 |
| 7,010,023 | B1* | 3/2006 | Sato | H04B 7/086 370/342 |
| 7,593,381 | B2* | 9/2009 | Tong | H04B 7/0854 370/342 |
| 7,640,040 | B2* | 12/2009 | Poilasne | H04B 1/1027 370/241 |
| 8,699,984 | B2* | 4/2014 | Mendoza | H04B 1/1027 455/150.1 |
| 8,723,730 | B2* | 5/2014 | Lu | G01S 5/04 342/464 |
| 8,749,432 | B2* | 6/2014 | Watanabe | G01S 19/21 342/357.67 |
| 9,318,799 | B2* | 4/2016 | Rousu | H01Q 1/3275 |
| 2012/0105271 | A1 | 5/2012 | Watanabe et al. | |
| 2014/0295782 | A1* | 10/2014 | Rousu | H01Q 1/3275 455/226.1 |
| 2016/0377731 | A1* | 12/2016 | Garg | G01S 19/24 342/357.25 |

OTHER PUBLICATIONS

International Search Report and Written Opinion—PCT/EP2016/067073—ISA/EPO—dated Jan. 19, 2017.

Lightsey G.E., et al., "Three-Axis Attitude Determination Using Global Positioning System Signal Strength Measurements," Journal of Guidance and Control, AIAA, New York, US, Mar. 1, 2003 (Mar. 1, 2003), vol. 26(2), pp. 304-310, XP007910960, DOI: 10.2514/2.5047.

Taro S., et al., "GNSS Positioning with Multipath Simulation using 3D Surface Model in Urban Canyon," GNSS 2012—Proceedings of the 25th International Technical Meeting of the Satellite Division of the Institute of Navigation (ION GNSS 2012), The Institute of Navigation, 8551 RIXLEW Lane Suite 360 Manassas, VA 20109, USA, Sep. 21, 2012 (Sep. 21, 2012), pp. 438-447, XP056008363.

Wang et al., "An Improved Single Antenna Attitude System Based on GPS Signal Strength," American Institute Of Aeronautics And Astronautics—Guidance, Navigation, And Control Conference, Jan. 1, 2005 (Jan. 1, 2005), pp. 1-15, XP007910961.

Yegin K, "On-Vehicle GPS Antenna Measurements," IEEE Antennas and Wireless Propagation Letters, IEEE, Piscataway, NJ, US, Jan. 2007 Jan. 1, 2007), vol. 6, 1 pp. 488-491, XP011194469, ISSN: 1536-1225.

* cited by examiner

ANTENNA PATTERN DATA MINING FOR AUTOMOTIVE GNSS RECEIVERS

This application relates, in general, to a system and a method for antenna pattern data mining. More specifically, this application relates to antenna pattern data mining for GNSS antennas located in vehicles.

BACKGROUND

Conventional global navigation satellite system (GNSS) receivers placed in vehicles, are able to determine the position of the vehicle by receiving GNSS signals from GNSS satellites. These conventional GNSS receivers may also attempt to eliminate multipath signals using methods that may be less than effective due to insufficiency of measurement data.

Therefore, these conventional methods may not be able to properly eliminate multipath signals, and as a consequence, the GNSS navigation solution is negatively affected. For example, the computed position may be erroneous, the calibration of sensors may be erroneous, etc.

SUMMARY

To meet this and other needs, and in view of its purposes, the described system includes a global navigation satellite system (GNSS) receiver in a vehicle, including a radio frequency (RF) receiving circuit configured to receive GNSS signals from a plurality of GNSS satellites orbiting Earth at respective azimuth and elevation angles, a memory device storing an predetermined antenna pattern including initial signal to noise ratio (SNR) values for each of the respective azimuth and elevation angles, and a processor. The processor is configured to calculate SNR values of the received GNSS signals, iteratively calculate an updated antenna pattern by combining the calculated SNR values with the initial SNR values, compare further SNR values of further received GNSS signals to the SNR values in the updated antenna pattern stored in the memory device to perform at least one of the following: 1) detection and mitigation of multipath signals, 2) estimation of vehicle heading, and 3) determination of a location of the antenna within the vehicle.

Also includes is a method for estimating of a global navigation satellite system (GNSS) receiver, including the steps of receiving, by a radio frequency (RF) receiving circuit, GNSS signals from a plurality of GNSS satellites orbiting Earth at respective azimuth and elevation angles, calculating, by the processor, signal to noise ratio (SNR) values of the received GNSS signals, iteratively calculating, by the processor, an updated antenna pattern by combining the calculated SNR values in the memory device with initial SNR values of an predetermined antenna pattern stored in the memory device, and comparing, by the processor, further SNR values of further received GNSS signals to the SNR values in the updated antenna pattern stored in the memory device to perform at least one of the following: 1) detection and mitigation of multipath signals, 2) estimation of vehicle heading, and 3) determination of a location of the antenna within the vehicle.

Also includes is a global navigation satellite system (GNSS) receiver in a vehicle, including a radio frequency (RF) receiving circuit configured to receive GNSS signals from a plurality of GNSS satellites orbiting Earth, a memory device storing an predetermined antenna pattern including initial signal strength values for each of the respective azimuth and elevation angles, and a processor. The processor is configured to calculate signal strength values of the received GNSS signals, calculate an updated antenna pattern by combining the calculated signal strength values with the initial signal strength values, compare further signal strength values of further received GNSS signals to the signal strength values in the updated antenna pattern stored in the memory device to perform at least one of the following: 1) detection and mitigation of multipath signals, 2) estimation of vehicle heading, and 3) determination of a location of the antenna within the vehicle.

It is understood that the foregoing general description and the following detailed description is exemplary, but not restrictive.

DETAILED DESCRIPTION

Figure 1:
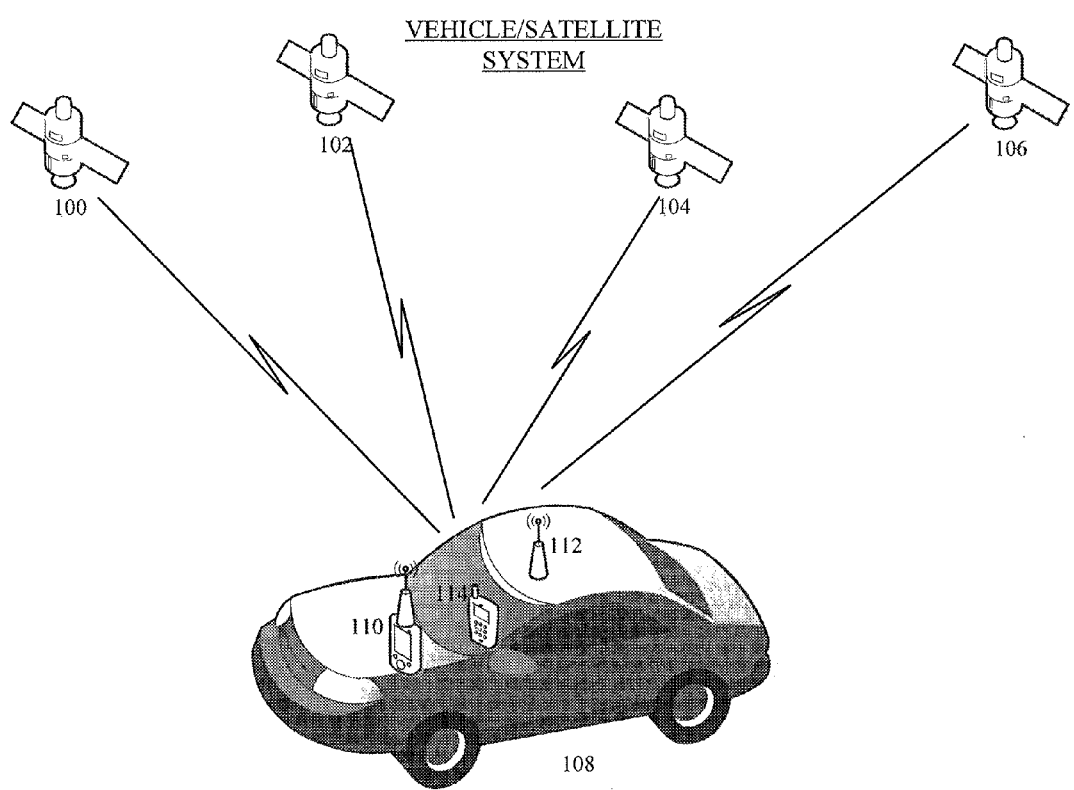
FIG. 1 is a diagram of a satellite/vehicle GNSS system, according to an example embodiment.

As described below, the example embodiments provide a system and a method for determining an antenna pattern (i.e. radiation pattern) of an antenna of a Global Navigation Satellite System (GNSS) receiver located in a vehicle. In one example, the GNSS receiver and the GNSS antenna may be integrated directly into the vehicle (e.g. navigation/communication system) internal to the vehicle for providing turn-by-turn directions to the driver. In another example, the GNSS receiver and the GNSS antenna may be integrated into a mobile In-Vehicle device (e.g. Tablet Computer, Smartphone, etc.) that may be in the possession of the user (e.g. the driver/passenger of the vehicle) while in the vehicle. In either scenario, the system (through signal measurements) determines the antenna pattern of the GNSS antenna and utilizes this antenna pattern in certain applications.

In general, a GNSS receiver, such as a global positioning satellite (GPS) receiver, is a navigation system that determines its position (and therefore the position of the vehicle or mobile phone) by measuring the arrival time of signaling events received from multiple satellites in Earth's orbit. Each satellite transmits a navigation message containing the time when the message was transmitted and ephemeris information which includes details about the satellite's orbit and corrections for the satellite's clock, in comparison with a universal or absolute time such as GNSS time. The ephemeris and clock correction parameters may collectively be known as ephemeris information. From the orbit information, the GNSS receiver can determine the elevation angle (i.e. angle of the satellite position with respect to the horizon) and the azimuth angle (i.e. angle of the satellite position with respect to geodetic North) of each satellite.

In general, GNSS signals may be formed of a navigation message binary phase shift modulated (BPSK) onto a direct sequence spread spectrum signal. The spread spectrum signal comprises a unique pseudo-noise (PN) code that may be different for each satellite. The code sequence may repeat itself, for example, every millisecond. The code sequence has an identified start instant when the two code generators in the satellite transition to the all-state. This instant is known as the code epoch. After various transport delays in the satellite, the code epoch is broadcast. This event is called a signaling event and can be recognized, in suitably adapted GNSS receivers, through a process of aligning a replica-code in the GNSS receiver with a code received from each satellite.

In addition to the time and ephemeris information, the data message may also contain satellite constellation almanac, parameters representing the ionospheric and tropospheric delay, Doppler shift, health parameters and other information used by some GNSS receivers.

As mentioned above, the GNSS receiver may determine a time of arrival (TOA) of a signaling event through a process of aligning a replica-code with the code received from each satellite. The GNSS receiver may also use the time of week (TOW) information contained in the navigation message to determine the time when the signaling event was transmitted. From this, the GNSS receiver can determine the time for the signaling event (from which it can determine the distance between it and the satellite), together with the position of the satellite at the time when the signaling event was transmitted (using the ephemeris information). The GNSS receiver then can calculate its own position fix estimate.

Theoretically, the position of the GNSS receiver can be determined using signals from three satellites. However, in practice, GNSS receivers use signals typically from four or more satellites to accurately determine three-dimensional location solution and an accurate time value due to a bias between the GNSS receiver clock and the GNSS time.

As described above, the GNSS receiver may be integrated directly into the vehicle or into a mobile device in possession of a user located in the vehicle. FIG. 1 shows an example of the vehicle/satellite system where the GNSS receiver/antenna is shown, in one example, as being integrated directly into the vehicle, and in another example, as being integrated into a mobile device (e.g. smartphone) in possession of a user located in the vehicle.

In general, FIG. 1 shows a satellite constellation including GNSS satellites 100, 102, 104 and 106 that are transmitting GNSS signals. In one example, vehicle 108 may include a vehicle integrated (e.g. dashboard) device 110 that includes both the GNSS receiver and the GNSS antenna for receiving the GNSS signals. In another example, the GNSS antenna may be located elsewhere (e.g. the roof) in the vehicle (i.e. device 110 may be electrically connected to GNSS antenna 112). In yet another example, a user (i.e. driver/passenger) may be in possession of mobile device 114 which includes both a GNSS receiver and a GNSS antenna. In either example, the GNSS satellites transmit GNSS signals. The GNSS receiver then receives and processes the GNSS signals in order to determine its position and determine the actual antenna pattern (i.e. radio frequency pattern) of the GNSS antenna.

Figure 2:
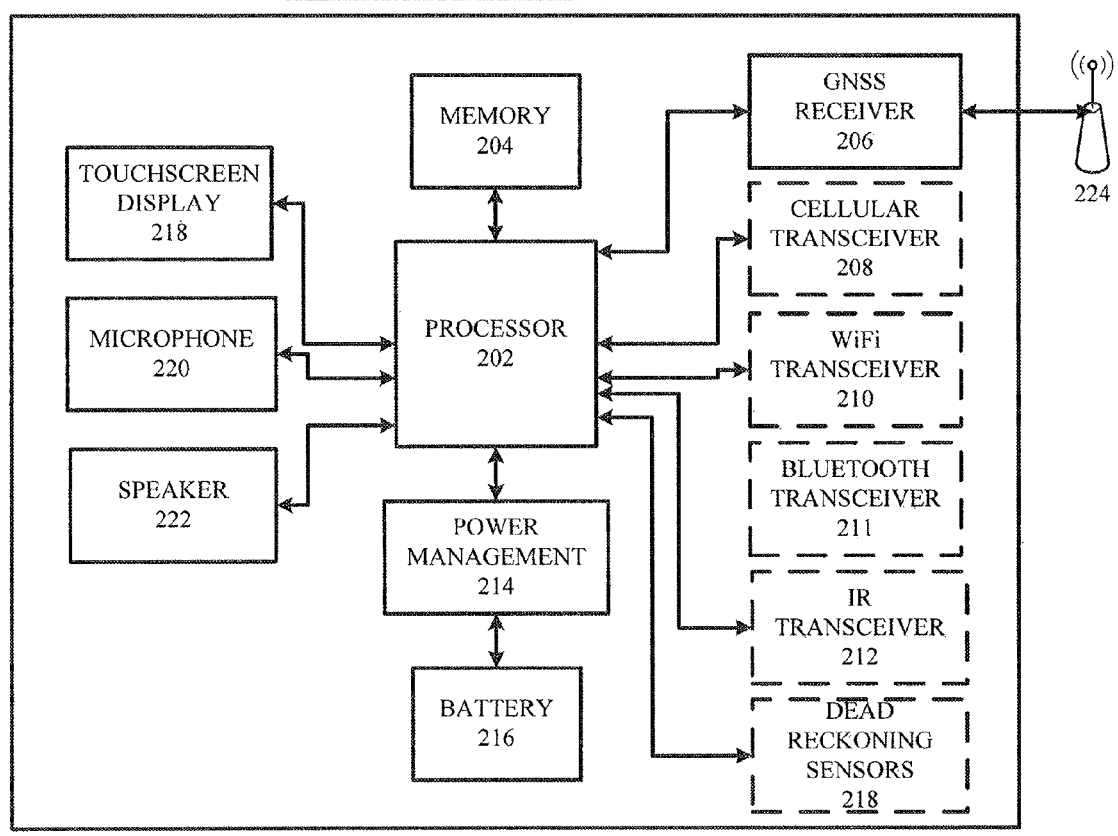
FIG. 2 is a drawing of hardware for the Smartphone/In-Vehicle device shown in FIG. 1, according to an example embodiment.

Shown in FIG. 2, are further hardware details of example in-vehicle devices 110, 112 and 114 from FIG. 1 that may be embodied as Smartphone/In-Vehicle device 200 which includes GNSS receiver 206. Smartphone/In-Vehicle device 200 may include hardware processor 202, memory device 204, power management system 214, battery 216, touch screen display 218, microphone 220, speaker 222, optional cellular transceiver 208, optional Wi-Fi transceiver 210, optional IR receiver 212, optional dead reckoning sensors 218, among others.

As described above, Smartphone/In-Vehicle device 200 may be a Smartphone, or an In-Vehicle device which may be integrated into the vehicle (e.g. Vehicle Navigation/Communication System), or may not be integrated in the vehicle (e.g. External Navigation Device, Tablet Computer, etc.). Although not dispositive, the implementation of Smartphone/In-Vehicle device 200 may determine the inclusion/exclusion of the optional components in FIG. 2.

The following examples are for illustration purposes. In a first example, the optional cellular transceiver 208, Wi-Fi transceiver 210, IR receiver 212 and dead reckoning sensors 218 (e.g. accelerometer and/or gyroscope) may be included when Smartphone/In-Vehicle device 200 is a Smartphone or other mobile device such as a Tablet computer. In a second example, optional dead reckoning sensors 218 (e.g. accelerometer, steering angle sensor, wheel speed sensor, compass, inclination sensor, brake sensor, light sensor, sound sensor, altitude sensor, etc.) and possibly the optional cellular transceiver 208, may be included when Smartphone/In-Vehicle device 200 is a system integrated into the internal navigation/communication system of the vehicle.

In either example described above, processor 202 controls the various components within Smartphone/In-Vehicle device 200. Memory 204 may include software and other data stored for access by processor 202. Power management system 214 may include a power circuit for ensuring that the voltage supplied by battery 216 or a battery of the vehicle (not shown) is of adequate quality for processor 202 and the other components within Smartphone/In-Vehicle device 200. Touch screen display 218 may allow the user to interact with the Smartphone/In-Vehicle device 200. In addition, microphone 220 may allow the user to speak into the Smartphone/In-Vehicle device, and speaker 222 may allow the Smartphone/In-Vehicle device to output audio to the user.

In addition to GNSS receiver 206, the Smartphone/In-Vehicle device 200 may also include optional cellular transceiver 208, optional Wi-Fi transceiver 210, optional Bluetooth transceiver 211, and optional IR transceiver 212 for receiving wireless communications via cellular RF transmissions, Wi-Fi transmissions and IR transmissions respectively. These three transceivers may allow Smartphone/In-Vehicle device 200 to both transmit and receive signals from other wireless devices using various wireless communication formats. In addition to these transceivers, dead reckoning sensors (e.g. accelerometer, gyroscope, steering angle sensor, wheel speed sensor, compass, etc.) may be included either in the device 200 or in the vehicle such that signals from the sensors are provided to the device 200. These sensors may be used on their own, or in conjunction with the GNSS receiver to estimate the vehicle position.

In addition, FIG. 2 shows a GNSS antenna 224 which may be integrated directly into smartphone/in-vehicle device 200. Alternatively, smartphone/in-vehicle device 200 may be electrically connected to the GNSS antenna 224 that is located (i.e. installed) at some other location within the vehicle. In either scenario, GNSS receiver 206 will receive GNSS signals from the GNSS antenna, and then process the signals accordingly.

Figure 3:
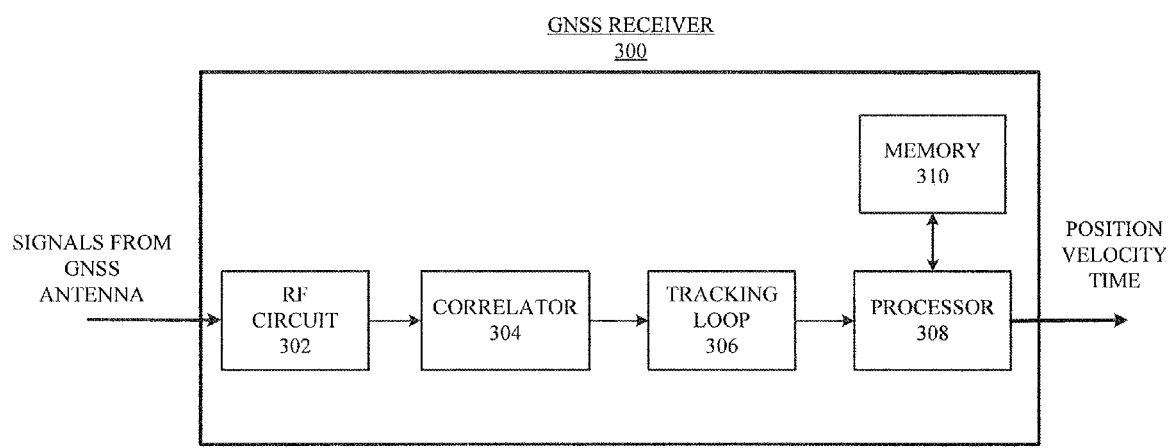
FIG. 3 is a drawing of hardware for the GNSS receiver shown in the Smartphone/In-Vehicle device in FIG. 2, according to an example embodiment.

Shown in FIG. 3 are further hardware details of the GNSS receiver 206 from FIG. 2. Specifically, GNSS receiver 300 in FIG. 3 includes a radio frequency (RF) circuit 302, correlator 304, tracking loop 306, processor 308 and memory 310. Although not shown in FIG. 3, the RF circuit is connected to, and receives signals from the GNSS antenna. The RF circuit may perform RF functions such as down-converting the transmitted RF signal so that it may be processed by correlator 304.

From the almanac data the GNSS receiver can determine which satellites should be visible. The GNSS receiver then selects one of these satellites. Given the identification of the satellite, the GNSS receiver knows the code being transmitted by the satellite, and therefore attempts to acquire the signal. After the signal is acquired, the GNSS receiver tracks changes in the signal over time. To acquire a signal a GNSS receiver may generate a replica-code and attempt to align it with the incoming received code by sliding the replica-code in time and computing the correlation in correlator 304. The output of correlator 304 is then input to tracking loop 306 which may be implemented as a delay lock-loop that continuously adjusts the replica-code to keep it aligned with the code in the incoming signal. After alignment is accomplished, the code may be removed from the signal leaving the carrier modulated by the navigation message.

This signal may then be tracked with a phase lock-loop in tracking loop 306. Since the track code is generated at instances in accordance with the satellite clock, the GNSS receiver can read the satellite clock time to determine when the code was generated and then utilize the computed time at the GNSS receiver to determine when the code was received. Multiplying the apparent transit time by the speed of light corrected for Doppler shift and ionospheric delays, gives the pseudo ranges of the satellites. These pseudoranges are then passed to processor 308 which implements a positioning algorithm (e.g. Kalman Filter, Least Squares Estimation, etc.) to compute the position, velocity and time of GNSS receiver 300. Processor 308 may be programmed with software code residing in memory 310 that instructs the processor on how to utilize the pseudo ranges and rate measurements in order to compute the position of the GNSS receiver 300.

In an example, processor 308 may utilize code from memory 310 to estimate the position, velocity and time of GNSS receiver 300 by using a least squares estimation based on the computed pseudo-ranges. In another example, processor 308 utilizes code from memory 310 to implement a Kalman filter that estimates the position, velocity and time of the GNSS receiver by using a time series of pseudo-range measurements and optional dead reckoning sensors. In either scenario, the estimated position of GNSS receiver 300 may then be output by processor 308 to the navigation system of the vehicle (i.e., assuming the GNSS receiver is integrated within the vehicle), or to other components of a mobile device (i.e., assuming the GNSS receiver is integrated in the mobile device such as a Smartphone or Tablet).

As described above, the GNSS receiver within vehicle 108 is able to determine both the elevation angle and azimuth angle of the satellites that are transmitting the GNSS signals. An illustration of the elevation and azimuth angles of the satellite is shown in FIG. 4.

Figure 4:
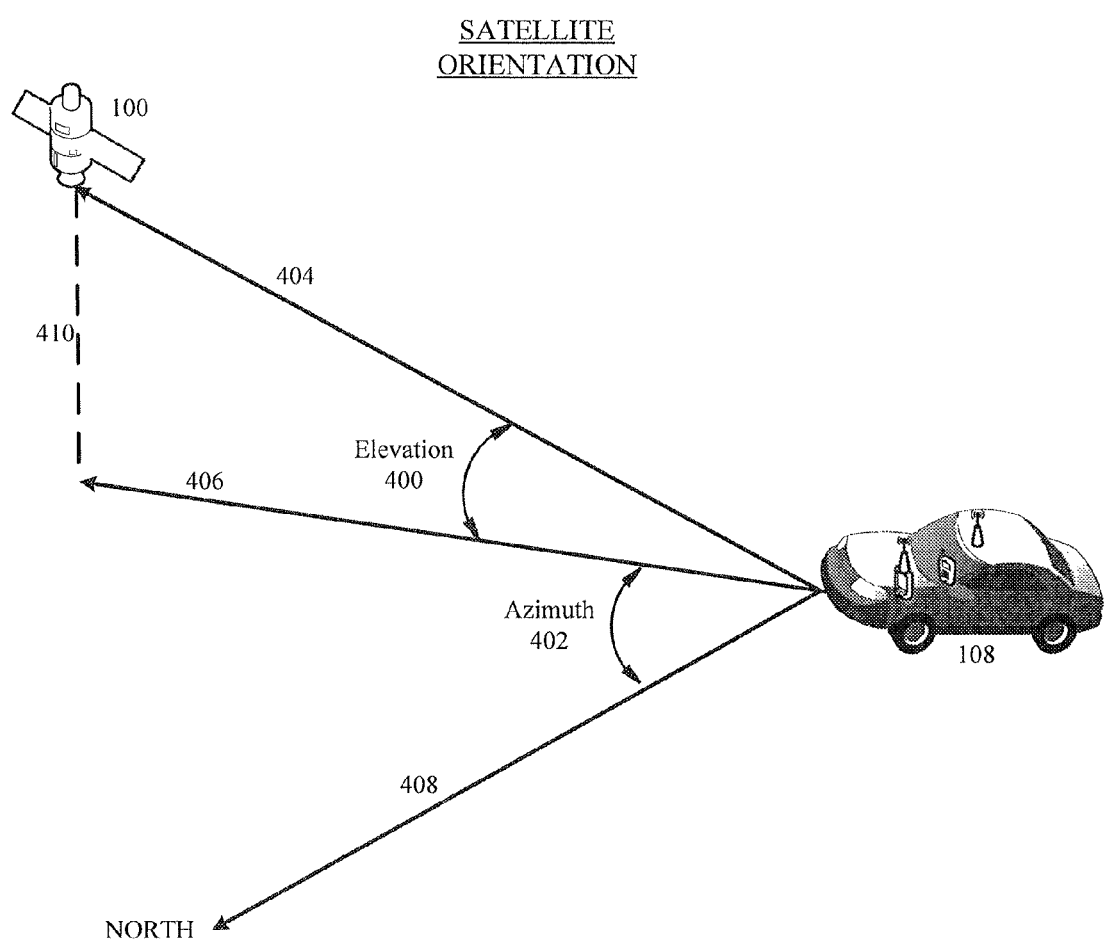
FIG. 4 is a diagram showing positional orientation between a satellite and the vehicle receiving signals from the satellite, according to an example embodiment.

Specifically, FIG. 4 shows line 406 being drawn from the vehicle out to the horizon. FIG. 4 also shows line 404 that is drawn from the vehicle up to the GNSS satellite 100. The angle between lines 404 and 406 is considered the elevation angle 400 (i.e. the angle of the satellite relative to the vehicle and horizon).

In addition, FIG. 4 also shows line 408 that is drawn from the vehicle to geodetic North. In general, the azimuth angle of the GNSS satellite 100 is typically in reference to geodetic North. In order to determine the azimuth angle with respect to the GNSS antenna within vehicle 108, GNSS receiver offsets the determined azimuth angle of GNSS satellite 100 based on the heading of the vehicle. This may be beneficial when determining the radiation pattern of the GNSS antenna within the vehicle. A more detailed explanation of how the radiation pattern is determined is described with respect to FIGS. 5 and 6.

It should be noted that the GNSS receiver antenna may be installed (i.e. during manufacturing) in different locations within the vehicle. For example, the GNSS antenna may be installed in the dashboard, the roof or some other portion of the vehicle.

Antenna manufacturers may provide a theoretical radiation antenna pattern for a given GNSS antenna. However, the actual radiation pattern of the antenna typically deviates from this theoretical pattern due to various factors that are not considered when the theoretical antenna pattern is computed. Specifically, impedance mismatch, obstructions due to vehicle metal parts, RF absorption of the materials covering the antenna, among others, have an effect on the radiation pattern of the antenna.

Since the theoretical antenna pattern is not an accurate representation of the actual antenna pattern after installation, it is beneficial to be able to determine the actual antenna pattern. One method for determining the actual radiation pattern of the GNSS antenna, is to mine data available to the GNSS receiver. Specifically, the GNSS receiver is able to determine the azimuth angle of the satellite, the elevation angle of the satellite and the signal to noise ratio (SNR) of the signals being transmitted from the satellite during GNSS tracking. These three pieces of information can be stored in a database (e.g. memory device 310) and utilized to determine (e.g. via processor 308) the actual radiation pattern of the antenna (i.e., each azimuth angle and elevation angle combination have an associated SNR value that can be stored in the database). It should be noted that other metrics (e.g. tracking loop parameters like synchronization status, loop bandwidth and duration of time in track) may be used along with or in place of SNR.

When attempting to determine the actual radiation pattern, the radiation pattern is initialized by the predetermined theoretical pattern provided by the antenna manufacturer, or by another generic antenna pattern that is known (i.e. previously mined) based on the location of the antenna within the vehicle. In general, the theoretical antenna pattern and the generic antenna pattern may include average, median, etc. SNR values for each azimuth/elevation angle combination for various satellites. It should also be noted that quantization of the azimuth/elevation angles is also possible. For example, average SNR values may be stored for 10° ranges (e.g. 0° to 10° will have a common SNR value). In either case, the SNR values and their corresponding azimuth/elevation angles and/or azimuth/elevation ranges are stored in memory device 310 of the GNSS receiver and used by the processor 308 as initial SNR values.

As the GNSS receiver receives GNSS signals (over time), further SNR values along with their respective azimuth and elevation angles are also computed and stored in memory device 310. Processor 308 then combines (e.g. average, median, etc.) the initial SNR values and the computed SNR values (for respective azimuth/elevation angles) in order to update the radiation pattern stored in the database.

As already described above, the azimuth of the GNSS satellite is oriented towards geodetic North. However, the actual radiation pattern may be generated such that the pattern is aligned to the axis of the vehicle (i.e., the pattern may be plotted based on the orientation of the vehicle). In order to generate an antenna radiation pattern referenced to the vehicles heading (i.e. the front of the vehicle), the azimuth angles are converted by offsetting them by the known heading of the vehicle.

For example, if the azimuth angle of the satellite (with respect to geodetic North) is 65°, and the heading of the vehicle (with respect to geodetic North) is 45°, the GNSS receiver offsets the azimuth angle of the satellite by 45° (i.e. the difference between the two angles) to obtain a resultant azimuth angle of 20°. This process provides the azimuth angle from the satellite to the front of the vehicle (not geodetic North).

This azimuth offsetting procedure may be visualized by a 2-dimensional rotation of an antenna pattern (e.g. the pattern shown in FIG. 6) by the resultant azimuth angle. For example, if the resultant angle difference between the azimuth of the satellite and the azimuth of the vehicle heading is determined to be 20° as described in the example above, the measured SNR value is inserted in the 2-dimensional antenna pattern as corresponding to a resultant azimuth of 20°.

In hardware or software, the rotation may, in one example, be performed by storing the SNR values (in memory) with an azimuth angle (in memory) that corresponds to the difference between the heading angle and the satellite angle. For example, if the SNR value computed for a corresponding azimuth angle of 65° was 20 dB prior to the rotation, this 20 dB value would be stored in memory with a corresponding azimuth angle of 20° after the rotation of 45°. The satellite azimuth angle of each SNR value would essentially be shifted by the azimuth angle of the vehicle heading.

Figure 5:
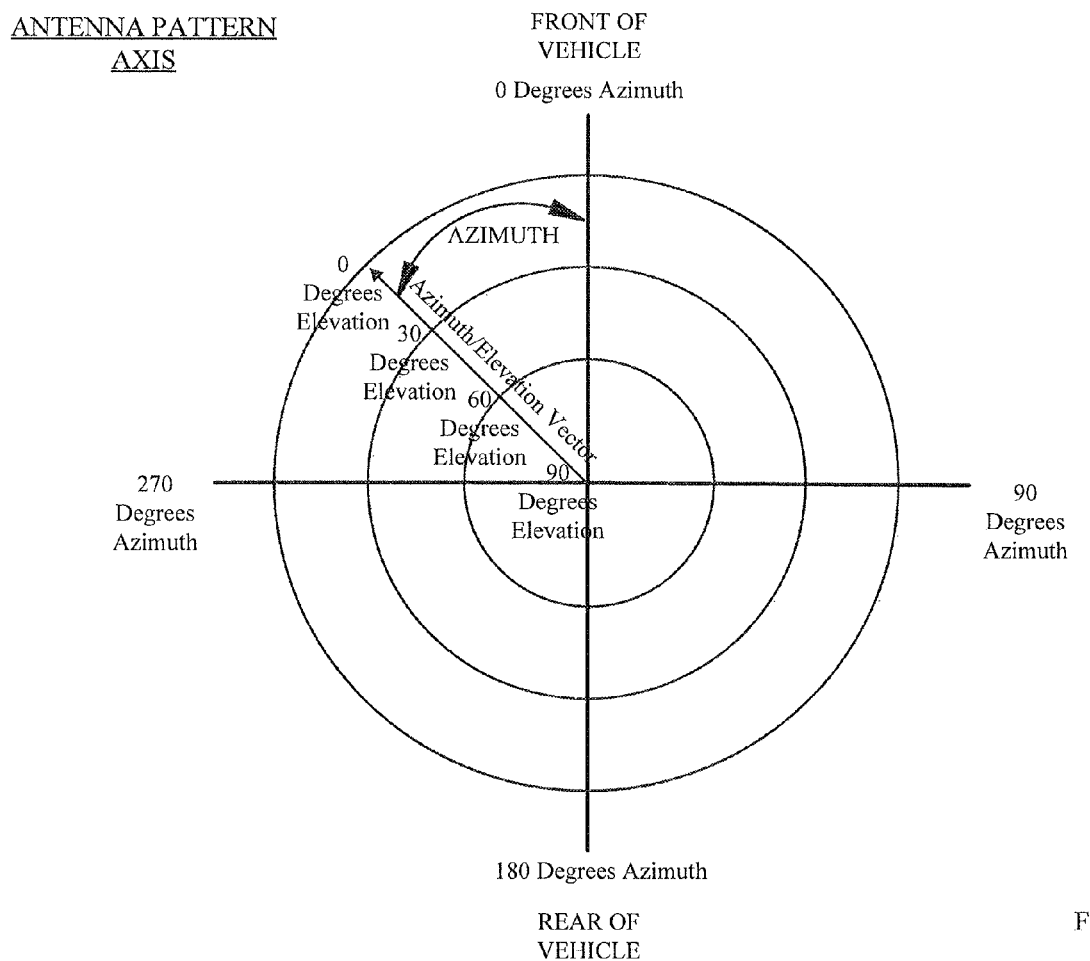
FIG. 5 is an axis for plotting an antenna pattern, according to an example embodiment.

Shown in FIG. 5 is an axis that illustrates how the antenna radiation pattern may be plotted (i.e. SNR value for a given azimuth and elevation angle). In general, the front of the vehicle is oriented towards the top of the plot, whereas the rear of the vehicle is oriented towards the bottom of the plot. The azimuth angle is measured from the front of the vehicle (i.e. top of the plot) in a counter-clockwise direction. The elevation angle is measured as a value that decreases from the origin of the plot towards the outer ring of the plot (i.e. elevation is 90 degrees at the origin and decreases to 0 degrees as the data gets closer to the outer ring).

In the example shown in FIG. 5, the vector length indicates the elevation of the satellite. For example, if the azimuth/elevation vector extended to the first inner ring, then the satellite would have an elevation angle of 60° above the horizon. However, as shown in FIG. 5, the vector extends all the way out to the outer ring of the plot which indicates that the satellite has an elevation angle of 0° with respect to the horizon (i.e., the satellite is directly overhead). Thus, if an SNR value was plotted on the outer ring where the vector is pointing, the elevation angle would be 0° and the azimuth angle would be approximately 315°

Figure 6:
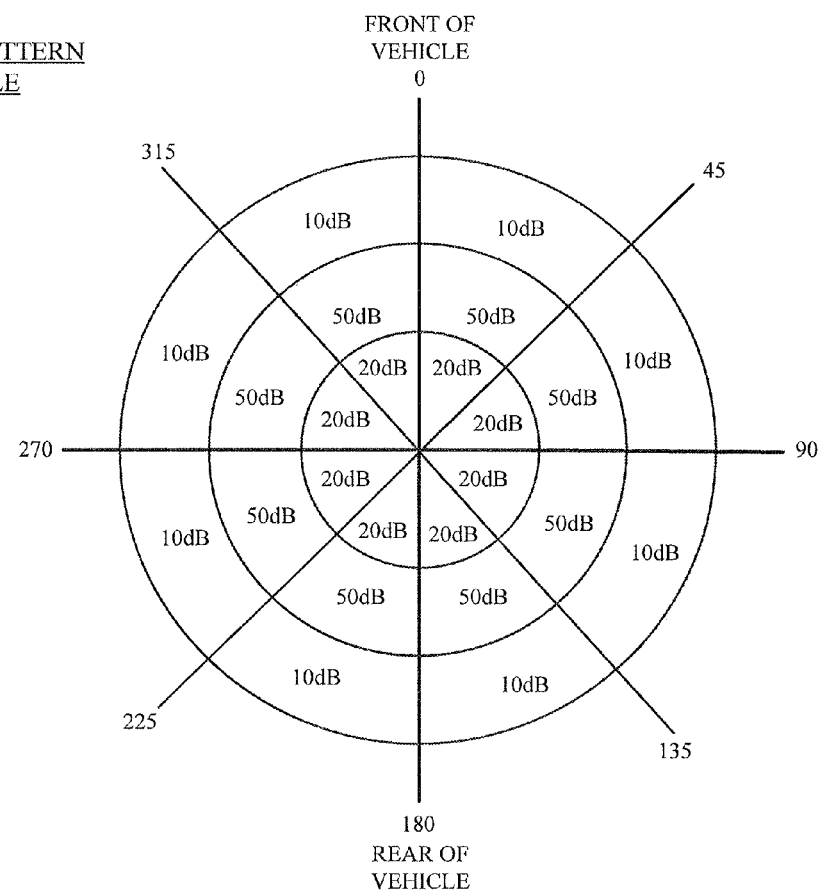
FIG. 6 is a plot of a simplified example antenna pattern, according to an example embodiment.

For clarification purposes, a simplified example of an antenna radiation pattern (using the axis from FIG. 5) is illustrated in FIG. 6. As shown in FIG. 6, the GNSS receiver has determined the SNR vales for satellite signals, and plotted these values into three possible elevation angle sections (0°, 30°, 60° and 90°), and eight possible azimuth angle sections (0°, 45°, 90°, 135°, 180°, 225°, 270° and 315°).

As is shown in FIG. 6, the SNR value when the elevation of the satellite is less than 30° is 20 dB (see the outer ring). However, the SNR value when the satellite is between 30° and 60° increases up to 50 dB (see the second ring). Finally, when the elevation of the satellite is increased to between 60° and 90° above the horizon, the SNR value once again decreases to 10 dB (see the inner ring).

It should be noted that this is a simplified example where the SNR is the same regardless of azimuth angle. However, in actual practice both the elevation and the azimuth angles will affect the SNR values. It is contemplated that each elevation angle/azimuth angle pair may have its own unique SNR.

It should also be noted that that in this simplified example only three different possible elevation angles and eight different possible azimuth angles were utilized. However, in actual practice, there could be an SNR value for each and every one of the 90 different elevation degrees and the 360 different azimuth degrees.

The simplified example shown in FIG. 6 may be the actual radiation pattern of an antenna when mounted in the roof of the vehicle. However, it is noted that this radiation pattern may change considerably if the antenna was mounted in another portion of the vehicle, such as in the dashboard or under the hood (i.e., the SNR values shown in FIG. 6 would change based on the placement of the antenna within the vehicle).

Figure 7:
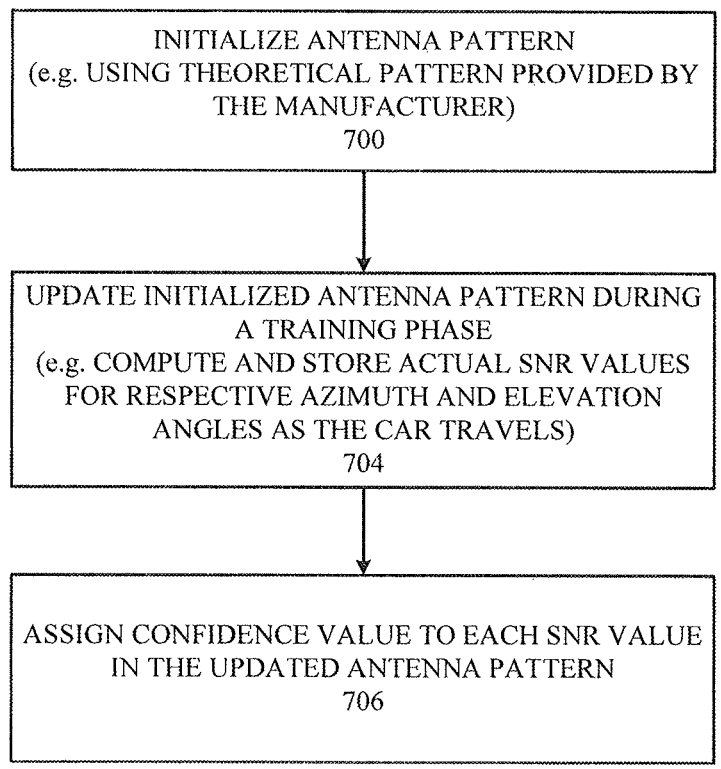
FIG. 7 is a flowchart describing steps for mining the antenna pattern, according to an example embodiment.

In order to produce the data plot in FIG. 6, the GNSS receiver mines the SNR values for every possible elevation/azimuth angle combination. For example, multiple SNR values at the same elevation/azimuth may be measured, stored and then averaged to produce an average SNR value for each elevation/azimuth combination. Further details of this mining process are described in the flowchart of FIG. 7.

Specifically, in step 700, the antenna pattern is initialized. This initialization may be performed based on the predetermined theoretical pattern provided by the manufacturer and pre-stored in memory 310, or by a previously mined pattern pre-stored in memory 310. In step 704, while the GNSS receiver is receiving GNSS signals from various satellites, the initialized model is then updated in what may be referred to as a training phase. During this training phase, the GNSS receiver computes and stores actual SNR values of received GNSS signals for respective azimuth and elevation angles that change as the car travels down the roadway, and as the satellites travel in their orbits. Each of these SNR values is then stored in a database (i.e., each elevation angle and azimuth angle combination has an associated SNR value measured by the GNSS receiver). These SNR values may then be combined (e.g. averaged) over time (e.g. the initial SNR values may be averaged with further SNR measurements).

This may be beneficial due to the accuracy of the vehicle heading being dependent on the speed of the vehicle. In general, as the vehicle is traveling at higher speeds and measuring the SNR values, these SNR values may be given higher confidence values than the SNR values that were measured while the vehicle was traveling at low speeds (i.e. higher speeds produce more accurate heading results and therefore are assigned a higher confidence value). In either case, the confidence value may be utilized by the GNSS receiver at a later point in time when the updated radiation pattern of the GNSS receiver is utilized in certain applications.

In general, once the updated antenna radiation pattern has been determined, this updated (i.e. actual) radiation pattern may be beneficial in different applications. Three of these applications are described with respect to the flowcharts in FIGS. 8, 9 and 10.

Figure 8:
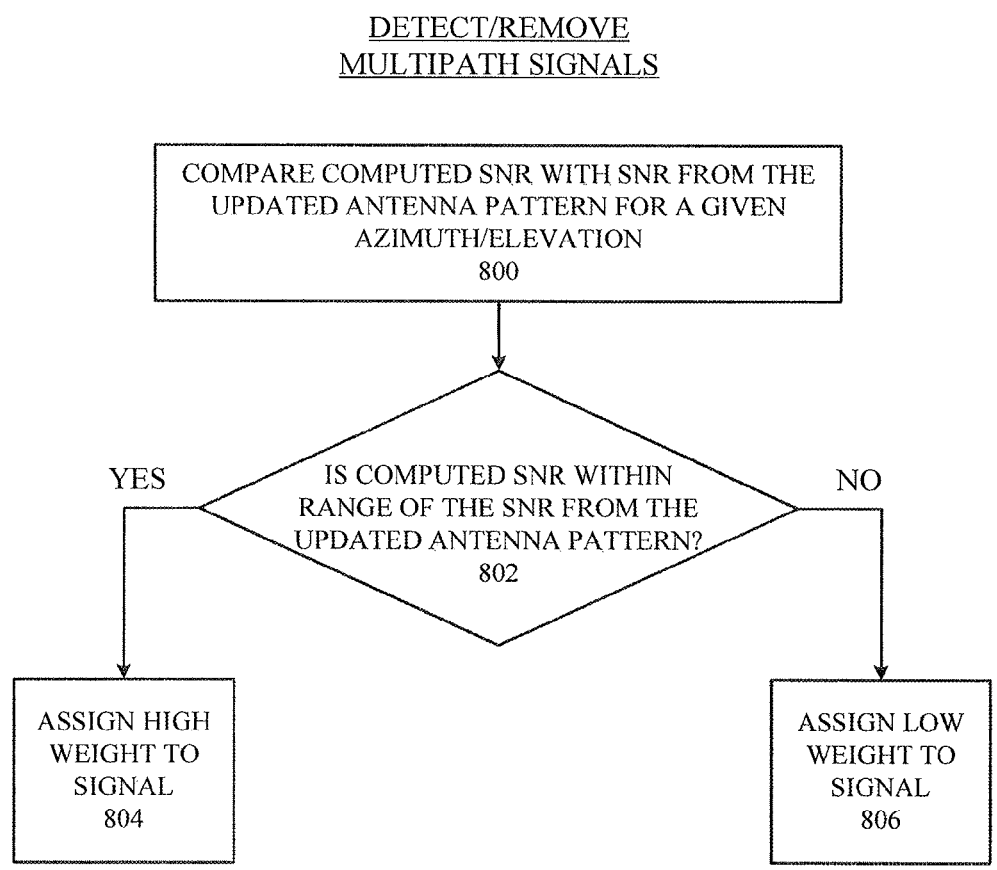
FIG. 8 is a flowchart describing steps detecting and removing multipath signals based on the mined antenna pattern, according to an example embodiment.

As shown in FIG. 8, the updated radiation antenna pattern may be utilized to detect and mitigate (e.g. weight, remove, etc.) multi-path signals that may affect the navigation solution of the GNSS receiver. Specifically, in step 800, the GNSS receiver is able to compare a currently computed SNR value with a stored SNR value from the updated antenna pattern for a given azimuth/elevation angle. The GNSS receiver (see step 802) may determine if the currently computed SNR value of the signal is within the certain range of the SNR value that is stored in the updated antenna pattern. If both SNR values are close to each other, then the GNSS receiver may assign a high weight to the currently received GNSS signal measurements, Pseudo-ranges, carrier phase, delta-ranges, etc. as shown in step 804. If the current SNR value, however, is not within range of the updated antenna pattern SNR, then the GNSS receiver may assign a low weight to the current GNSS signal as shown in step 806.

Essentially, if the SNR value of the currently received GNSS signal is not within a certain range of the SNR value stored in the updated antenna pattern, it may be assumed that the currently received GNSS signal is a multi-path signal which will either be ignored or assigned a low weight when determining the navigation solution. This process is performed in an attempt to minimize errors due to multi-path signals.

It should also be noted that the GNSS receiver is also configured to distinguish between a multipath environment (e.g. urban jungle) and a low SNR environment (e.g. tunnel). For example, if signals from one satellite have low SNR values while signals from another satellite have high SNR values, the GNSS receiver may determine that the vehicle is located in a multipath environment. However, if signals from multiple satellites are all showing low SNR values at a given time, the GNSS receiver may determine that the vehicle is located in a low SNR environment.

Figure 9:
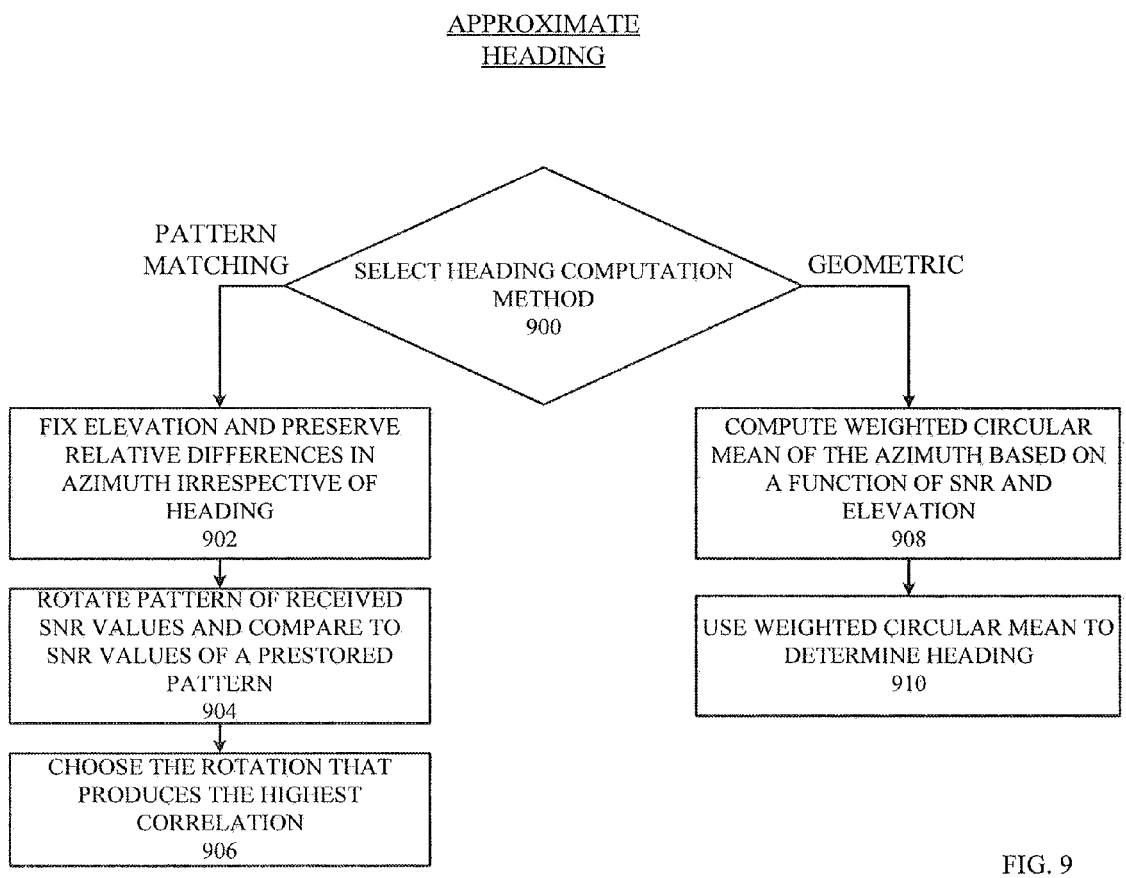
FIG. 9 is a flowchart describing steps for determining approximate heading of the vehicle based on the mined antenna pattern, according to an example embodiment.
Figure 10:
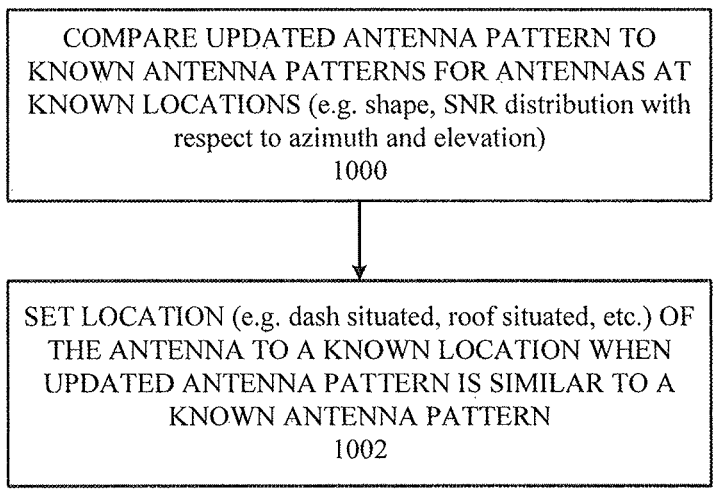
FIG. 10 is a flowchart describing steps for determining the location of the antenna within the vehicle based on the mined antenna pattern, according to an example embodiment.

Another application for utilizing the stored updated antenna pattern is shown in FIG. 9 where the heading of the vehicle may be more accurately determined. Shown in FIG. 9 are two different possible heading computation methods. In step 900, the system may select a particular heading computation method. If a pattern matching heading computation method is computed, then in step 902, the elevation angle is fixed and the system preserves the relative differences in azimuth angles irrespective of heading. In step 904, the GNSS receiver compares the pattern of the SNR values of the received signals to all heading possibilities of a pre-stored (i.e. previously mined) antenna radiation pattern by rotating the pattern of received SNR values, and computing a difference between the pattern of SNR values and the SNR values of the pre-stored antenna pattern at each rotation. In step 906, the GNSS receiver chooses the rotation angle that generates the best match (e.g. highest correlation) between the pattern of received SNR values and the SNR values of the pre-stored antenna pattern. This angle is then used to determine heading of the vehicle.

If, however, in step 900 the GNSS receiver selects the geometric heading computation method, then in step 908 the GNSS receiver computes a weighted circular mean of the azimuth angle SNR values based on a function of SNR and elevation. To computed the weighted circular mean, the azimuths of all visible satellites (after a validity check using the mined pattern) are averaged. The weights for each heading are computed as a function of SNR and elevation and other information available from the satellite measurement. In step 910, the GNSS receiver then uses this weighted circular mean to determine the heading of the vehicle. The weighted circular mean may be especially useful for nearly symmetric patterns or when the antenna is on the roof of the vehicle.

In yet another application, the stored updated antenna radiation pattern may be used to determine the location of the antenna within the vehicle (e.g. whether the antenna is mounted in the roof, dashboard, under the hood, etc.). In step 1000, for example, the GNSS receiver compares the stored updated antenna pattern to other known antenna patterns that are stored in the database. These known antenna patterns are for antennas that are located at known locations. These know antenna patterns may have a distinctive shape and SNR distribution within the database with respect to azimuth and elevation angles. In step 1002, the GNSS receiver then sets the location (for example, dashboard, roof, etc.) of the current GNSS antenna to one of the known locations when the updated antenna pattern is similar to one of the known antenna patterns stored in the database (e.g. if the SNR distribution of the antenna matches a known SNR distribution of a roof mounted antenna, then it can be determined that the antenna is mounted in the roof). Knowing the antenna location within the vehicle, the nature of the received multipath signal may be determined. For example, there is more chance of multipath for the antenna located inside the vehicle dashboard than for the antenna located on the roof the vehicle.

In determining the location of the antenna within the vehicle, a comparison is performed between the updated antenna pattern and antenna patterns (e.g. previously mined antenna patterns at corresponding locations in the vehicle) pre-stored in memory 310. This comparison can be made by determining a difference between each SNR value between the updated antenna pattern and multiple pre-stored antenna patterns at their respective azimuth/elevation angles. These differences may be used to determine the overall difference (e.g. correlation) between the updated antenna pattern and multiple pre-stored antenna patterns. The pre-stored antenna pattern that provides the lowest overall difference (i.e. highest correlation) may be chosen as the best candidate. Once the best candidate is chosen, the location of the antenna is determined to be the same as the location that corresponds to the pre-stored antenna pattern.

By being able to determine the actual antenna radiation, the GNSS receiver is able to utilize this information in many beneficial ways. Detecting and mitigating (e.g. removing/weighting) multi-path signals, determining heading and determining the location of the antenna within the vehicle are just three of many possible beneficial uses for knowing the actual antenna radiation pattern as opposed to the theoretical pattern that is provided by the manufacturer.

Although the system is illustrated and described herein with reference to specific embodiments, it is not intended to be limited to the details shown. Rather, various modifications may be made in the details within the scope and range of equivalents of the claims.

What is claimed:

1. A global navigation satellite system (GNSS) receiver in a vehicle, comprising:
   a radio frequency (RF) receiving circuit configured to receive GNSS signals from a plurality of GNSS satellites orbiting Earth at respective azimuth and elevation angles;
   a memory device storing a predetermined antenna pattern including initial signal to noise ratio (SNR) values for each of the respective azimuth and elevation angles; and
   a processor configured to:
      calculate SNR values of the received GNSS signals,
      iteratively calculate an updated antenna pattern by combining the calculated SNR values with the initial SNR values,
      compare further SNR values of further received GNSS signals to the SNR values in the updated antenna pattern stored in the memory device to perform the following: 1) detection and mitigation of multipath signals received by the RF receiving circuit, 2) estimation of vehicle heading of the vehicle, or 3) determination of a location of the GNSS receiver within the vehicle or any combination thereof, and
      determine a location of the GNSS receiver using the updated antenna pattern and the RF receiving circuit.

2. The GNSS receiver of claim 1,
   wherein the predetermined antenna pattern is based on manufacturer SNR specifications stored in the memory device.

3. The GNSS receiver of claim 1,
   wherein the processor is further configured to assign a confidence value stored in the memory device to each of the calculated SNR values in the updated antenna pattern.

4. The GNSS receiver of claim 1,
   wherein the processor is further configured to offset the azimuth angle of the satellite based on a heading of the vehicle such that the updated antenna pattern is aligned to an azimuth axis of the vehicle.

5. The GNSS receiver of claim 1,
   wherein when calculating the updated antenna pattern the processor is further configured to:
      compare the calculated SNR values with SNR values from the updated antenna pattern for a given azimuth/elevation angle,
      determine if the calculated SNR values are within range of the SNR values from the updated antenna pattern,
      assign a first weight stored in the memory device to the received signal when the calculated SNR value is within the range, and
      assign a second weight stored in the memory device to the received signal when the calculated SNR value is outside the range,
   wherein the first weight is greater than the second weight.

6. The GNSS receiver of claim 1,
   wherein the processor is further configured to estimate the vehicle heading of the vehicle by:
      comparing the SNR values of the updated pattern stored in the memory device to respective SNR values of another antenna pattern stored in the memory device for a plurality of heading possibilities, and choosing the heading possibility that generates a best match, or
      computing a weighted circular mean of an azimuth angle based on a function of the SNR values stored in the memory device and an elevation angle.

7. The GNSS receiver of claim 1,
   wherein the processor is further configured to determine the location of the GNSS receiver within the vehicle by:
      comparing the updated antenna pattern to known antenna patterns of GNSS receivers at known locations stored in the memory device, and
      setting the location of the GNSS receiver to the known location when updated antenna pattern is similar to the known antenna pattern.

8. A method for use in a global navigation satellite system (GNSS) receiver in a vehicle, comprising:
   receiving, by a radio frequency (RF) receiving circuit, GNSS signals from a plurality of GNSS satellites orbiting Earth at respective azimuth and elevation angles,
   calculating, by a processor, signal to noise ratio (SNR) values of the received GNSS signals,
   iteratively calculating, by the processor, an updated antenna pattern by combining the calculated SNR values in a memory device with initial SNR values of a predetermined antenna pattern stored in the memory device,
   comparing, by the processor, further SNR values of further received GNSS signals to the SNR values in the updated antenna pattern stored in the memory device to perform at least one of the following: 1) detection and mitigation of multipath signals received by the RF receiving circuit, 2) estimation of vehicle heading of the vehicle, or 3) determination of a location of the GNSS receiver within the vehicle or any combination thereof, and
   determining a location of the GNSS receiver using the updated antenna pattern and the RF receiving circuit.

9. The method of claim 8, wherein
   the predetermined antenna pattern is based on manufacturer SNR specifications stored in the memory device.

10. The method of claim 9, further comprising:
    assigning, by the processor, a confidence value stored in the memory device to each of the calculated SNR values in the updated antenna pattern stored in the memory device.

11. The method of claim 8, further comprising:
    offsetting, by the processor, the azimuth angle of the satellite based on a heading of the vehicle such that the updated antenna pattern is aligned to an azimuth axis of the vehicle.

12. The method of claim 8,
    wherein calculating the updated antenna pattern comprises:
       comparing the calculated SNR values with SNR values from the updated antenna pattern for a given azimuth/elevation angle,
       determining if the calculated SNR values are within range of the SNR values from the updated antenna pattern,
       assigning a first weight stored in the memory device to the received signal when the calculated SNR value is within the range, and
       assigning a second weight stored in the memory device to the received signal when the calculated SNR value is outside the range,
    wherein the first weight is greater than the second weight.

13. The method of claim 8,
    wherein estimation of a vehicle heading of the vehicle comprises:

comparing the SNR values of the updated pattern stored in the memory device to respective SNR values of another antenna pattern stored in the memory device for a plurality of heading possibilities, and choosing the heading possibility that generates a best match, or computing a weighted circular mean of an azimuth angle based on a function of the SNR values stored in the memory device and an elevation angle.

14. The method of claim 8,
wherein determination of the location of the GNSS receiver within the vehicle comprises:
comparing the updated antenna pattern to known antenna patterns of GNSS receivers at known locations stored in the memory device, and
setting the location of the GNSS receiver to the known location when updated antenna pattern is similar to the known antenna pattern.

15. A global navigation satellite system (GNSS) receiver in a vehicle, comprising:
a radio frequency (RF) receiving circuit configured to receive GNSS signals from a plurality of GNSS satellites orbiting Earth at respective azimuth and elevation angles;
a memory device storing a predetermined antenna pattern including initial signal strength values for each of the respective azimuth and elevation angles; and
a processor configured to:
calculate signal strength values of the received GNSS signals,
calculate an updated antenna pattern by combining the calculated signal strength values with the initial signal strength values,
compare further signal strength values of further received GNSS signals to the signal strength values in the updated antenna pattern stored in the memory device to perform at least one of the following: 1) detection and mitigation of multipath signals received by the RF receiving circuit, 2) estimation of vehicle heading of the vehicle, or 3) determination of a location of the GNSS receiver within the vehicle or any combination thereof, and
determine a location of the GNSS receiver using the updated antenna pattern and the RF receiving circuit.

16. The GNSS receiver of claim 15,
wherein the signal strength values are signal to noise ratio (SNR) values.

17. The GNSS receiver of claim 15,
wherein the processor is further configured to:
initialize the antenna pattern based on manufacturer specifications stored in the memory device, and
assign a confidence value stored in the memory device to each of the calculated signal strength values in the updated antenna pattern.

18. The GNSS receiver of claim 15,
wherein when calculating the updated antenna pattern the processor is further configured to:
compare the calculated signal strength values with signal strength values from the updated antenna pattern for a given azimuth/elevation angle,
determine if the calculated signal strength values are within range of the signal strength values from the updated antenna pattern,
assign a first weight stored in the memory device to the received signal when the calculated signal strength value is within the range, and
assign a second weight stored in the memory device to the received signal when the calculated signal strength value is outside the range,
wherein the first weight is greater than the second weight.

19. The GNSS receiver of claim 15,
wherein the processor is further configured to estimate the vehicle heading of the vehicle by:
comparing the signal strength values of the updated pattern stored in the memory device to respective signal strength values of another antenna pattern stored in the memory device for a plurality of heading possibilities, and choosing the heading possibility that generates a best match, or
computing a weighted circular mean of an azimuth angle based on a function of the signal strength values stored in the memory device and an elevation angle.

20. The GNSS receiver of claim 15,
wherein the processor is further configured to determine the location of the GNSS receiver within the vehicle by:
comparing the updated antenna pattern to known antenna patterns of GNSS receivers at known locations stored in the memory device, and
setting the location of the GNSS receiver to the known location when updated antenna pattern is similar to the known antenna pattern.

* * * * *